United States Patent
Ootera et al.

(10) Patent No.: US 6,167,835 B1
(45) Date of Patent: Jan. 2, 2001

(54) TWO CHAMBER PLASMA PROCESSING APPARATUS

(75) Inventors: Hiroki Ootera; Masakazu Taki; Kenji Shintani; Kazuyasu Nishikawa, all of Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/047,935

(22) Filed: Mar. 26, 1998

(30) Foreign Application Priority Data

Mar. 27, 1997 (JP) .................................................. 9-076031

(51) Int. Cl.[7] .................................................. C23C 16/00
(52) U.S. Cl. ............... 118/723 E; 118/715; 118/723 ER; 422/186.04
(58) Field of Search ..................................... 118/715, 716, 118/719, 723 ER, 723 MA, 723 E; 156/345; 315/111.21; 422/186.04

(56) References Cited

U.S. PATENT DOCUMENTS

| | | | |
|---|---|---|---|
| 4,943,361 | * | 7/1990 | Kakehi et al. .................. 204/192.32 |
| 5,108,535 | | 4/1992 | Ono et al. . |
| 5,525,159 | * | 6/1996 | Hama et al. ......................... 118/723 |
| 5,680,014 | * | 10/1997 | Miyamoto et al. .............. 315/111.41 |
| 5,928,528 | * | 7/1999 | Kubota et al. .......................... 216/67 |

FOREIGN PATENT DOCUMENTS

| | | |
|---|---|---|
| 51-88182 | 8/1976 | (JP) . |
| 58-204538 | 11/1983 | (JP) . |
| 2-9452 | 1/1990 | (JP) . |
| 2-94520 | 4/1990 | (JP) . |
| 4-72082 | 3/1992 | (JP) . |
| 5-283372 | 10/1993 | (JP) . |
| 07263353 | * 3/1994 | (JP) . |
| 7-122543 | 5/1995 | (JP) . |
| 7-263353 | 10/1995 | (JP) . |
| 7-283203 | 10/1995 | (JP) . |
| 8-111402 | 4/1996 | (JP) . |

OTHER PUBLICATIONS

"Field–Induced Surface Rearrangement in a Field–Ion Microscope", A. Van Oostrom Applied Physics Letters, vol. 17, No. 5, Sep. 1, 1970, pp. 206–208.

Low Temperature Reactive Ion Etching and Microwave Plasma Etching of Silicon, S. Tachi et al. Applied Physics Letters 52(8), Feb. 22, 1988, pp. 616–618.

"Plasma Jet Dry Etching Using Different Electrode Configurations", A.M. Barklund et al. J. Vac. Sci. Technol. A9(3), May/Jun. 1991, pp. 1055–1057HY.

* cited by examiner

Primary Examiner—Kathryn Gorgos
Assistant Examiner—Wesley A. Nicolas
(74) Attorney, Agent, or Firm—McDermott, Will & Emery

(57) ABSTRACT

A plasma processing apparatus has a plurality of annular permanent magnets arranged concentrically of a polarity identical in the circumferential direction at the atmosphere side of a second electrode arranged opposite to a stage on which an object to be processed is placed. Arrangement is provided so that the polarity of magnets located adjacent radially is opposite. An insulation substrate is provided between a partition panel and a processing chamber to electrically insulate a plasma generation chamber. Direct current voltage is applied in a pulsive manner to the plasma generation chamber. Thus, a plasma processing apparatus can be provided that allows formation of plasma uniformly over a large area, and processing of a specimen of a large diameter uniformly.

2 Claims, 7 Drawing Sheets

H=50

TWO CHAMBER PLASMA PROCESSING APPARATUS

BACKGROUND OF THE INVENTION

1. Field of the Invention

The present invention relates to plasma processing apparatuses, and more particularly, to a plasma processing apparatus that forms a thin film On the surface of an object of interest or that etches the surface of an object taxing advantage of plasma.

2. Description of the Background Art

FIG. 4 is a schematic sectional view of a conventional plasma processing apparatus disclosed in, for example, Japanese Patent Laying-Open No. 2-9452. Referring to FIG. 4, the conventional plasma apparatus includes a vacuum vessel 101 a first electrode 103 on which an object 102 to be processed is placed, and a second electrode 104 arranged opposite to first electrode 103

Etching gas is introduced through a gas inlet 105 into vacuum vessel 1 and exhausted through an exhaust port 106. A high frequency power source 107 is connected to first electrode 103 via a matching circuit 108. A permanent magnet 109 is arranged at the atmosphere side of second electrode 104. A cooling mechanism 110 is connected to first electrode 103. In FIG. 4, E indicates the electric field and B is the component of the magnetic field induced by magnet 109, parallel to first electrode 103.

The operation of the plasma processing apparatus of the above structure will be described hereinafter. When etching gas is introduced into the plasma chamber of vacuum vessel 101 from gas inlet 105, plasma is generated between first and second electrodes 103 and 104 by the high frequency power applied to first electrode 103.

The apparatus shown in FIG. 4 is directed to achieve high electron density even at a low pressure by magnetron discharge. The apparatus of FIG. 4 is set so that the magnetic flux density at the surface of first electrode 103 is approximately 200 G.

At the sheath region (the region where plasma is in contact with first electrode 103), the charged particles (electrons and ions) drift in the direction of E×B while moving cycloidally under the influence of the sheath electric field and magnetic field.

As a result, the probability of collision between an electron and a neutron (molecule, atom) increases to promote ionization. Accordingly, plasma of high density is generated even at a low pressure to achieve a high etching rate. In this case, plasma loss is reduced by the magnetic field caused by permanent magnet 109. Therefore, the high density plasma is maintained to allow etching of object 102 of interest.

It is now necessary to generate uniform plasma over a large area for the purpose of processing objects of large diameter such as 8 inch or 10 inch in size. However, the magnetic flux density in the lateral direction (parallel between electrodes) at the surface of second electrode 104 of the above-described plasma processing apparatus with the arrangement of a single permanent magnet is low at the center and becomes higher uniformly in the radial direction as shown in FIG. 5(B). The overall magnetic flux density is not uniform. It is therefore difficult to form a magnetic field of uniform intensity in the proximity of the object to be processed.

It is not easy to generate plasma uniformly despite its homogeneous action by diffusion. FIG. 5(A) shows a permanent magnet of 200 mm in diameter and 50 mm in height with the surface magnetic flux density entirely uniform at 3 kG. FIG. 5(B) is a graph of the magnetic field distribution in the lateral direction at the surface of second electrode 104 remote from the permanent magnet of FIG. 5(A) by 35 mm. The magnetic field intensity $B\perp(G)$ in the lateral direction is plotted along the ordinate, and the distance r(mm) from the center is plotted along the abscissa.

The magnetic field distribution at the surface of the object to be processed placed on first electrode 103 is also not uniform. Since the movement of a charged particle is greatly affected by the magnetic field distribution, the flux of the incident charged particles at the surface of the object to be processed is also not uniform, reflecting the nonuniform magnetic field distribution. As a result, the distribution of the charge density is disturbed at the surface of the object to be processed to damage the device.

In the event that a plurality of permanent magnets are used, the magnetic field distribution will be nonuniform similar to the above case with a single magnet if the permanent magnets are arranged so that adjacent magnets have the same polarity. Therefore, the uniformity of the plasma was not sufficient even if the homogeneous action by plasma diffusion is taken into account.

The aforementioned Japanese Patent Laying-Open No. 2-9452 also discloses arrangement of a plurality of rod-like permanent magnets with the polarity between adjacent magnets being the opposite, as shown in the sectional view of FIG. 6(A). When the polarity is altered alternately, the distribution in the radial direction of the lateral magnetic flux density $B\perp$ at the surface of second electrode 104 is indicated by the waveform of FIG. 7(B) according to the arrangement of permanent magnets 109 of FIG. 7(A).

It is appreciated from FIGS. 7(A) and 7(B) that the position of the peak can be controlled by altering the distance between the magnets although $B\perp$ is not uniform radially. Homogeneity can be achieved by generating the plasma in such a magnetic field coordination since the plasma is spread by diffusion even to the region where the magnetic field is weak. Because of reduction in loss in contrast to the case where there is no magnet, uniform plasma of high density can be obtained.

In the parallel arrangement of a plurality of rod-like permanent magnets 109 as shown in FIG. 6(A), magnetic fields $B_1$ and $B_2$ are generated as shown in FIG. 6(B). At region (A) in the proximity of the object to be processed, the plasma drifts in the direction piercing the plane of the drawing sheet by the E×B drift caused by electric field E and magnetic field $B_1$. At the region of (B), plasma drifts in the opposite direction by electric field E and magnetic field $B_2$ to become locally dense.

Focusing on the movement of the charged particles at the sheath portion at the surface of second electrode 104, the direction of drift (indicated by arrows) differs for every pair of adjacent permanent magnets 109 due to the E×B drift as shown in FIG. 8. The region of the shaded area indicated by × in the drawing has high density due to the high plasma density portion corresponding to the direction of the drift. As a result, nonuniformity occurs in the plasma density with the parallel arrangement. This means that uniformity in the etching rate is degraded. This is a critical problem in the parallel arrangement of permanent magnets.

FIG. 9 shows a schematic structure of another conventional plasma processing apparatus having the plasma generation chamber and the processing chamber divided. Such a plasma processing apparatus is disclosed in Japanese Patent Laying-open No. 51-88182, for example. Referring to FIG. 9, a processing chamber 121 is evacuated by a diffusion pump 132 via a main valve 131 and an auxiliary rotary pump 133. A plasma generation chamber 122 is provided above processing chamber 121. Counter electrodes 118 and 119 are connected to ground at plasma generation chamber 122. Counter electrode 119 with a plurality of holes 20 is provided as a partition wall to divide plasma generation chamber 122 and processing chamber 121. A raw material gas cylinder 134 is connected to a gas conduit 115.

The operation of the plasma processing apparatus of the above structure will be described hereinafter. The etching gas introduced into plasma generation chamber 122 through gas conduit 115 passes through processing chamber 122 to be output by a vacuum pump. Difference in pressure between plasma generation chamber 122 and processing chamber 121 is generated by the conductance of holes 120 provided between plasma generation chamber 122 and processing chamber 121.

According to specific figures disclosed in the prior art, the pressure of plasma generation chamber 122 is maintained at $1\sim5\times10^{-1}$ Torr and the pressure of processing chamber 121 is maintained at not more than $1\times10^{-3}$ Torr under the conditions of seven holes each having a diameter of 0.1–0.8 mm at the effective evacuation rate of 1000 L/sec. of the exhaust system and the flow rate of 50–100 cc/min. of the raw material gas.

By supplying a high frequency power to counter electrodes 118 and 119 by a high frequency power source 117, plasma is generated in plasma generation chamber 122. The plasma passes through holes 120 to etch object 102 placed on a table 126 in processing chamber 121.

In the plasma processing apparatus of the above structure, the plasma generated at plasma generation chamber 122 by the parallel-plate high frequency discharge had the density of $5\times10^8$ (particles/cm$^3$) to $5\times10^9$ (particles/cm$^3$). The processing speed of object 102 is relatively proportional to the density of incident plasma towards object 102. Limitation in the generated plasma density prevents the object of interest to be processed at high speed since plasma of high density cannot be introduced into processing chamber 121. Also, the pressure in plasma generation chamber 122 maintained by the parallel-plate high frequency discharge is approximately 0.1 Torr. Thus, there was a problem that the object cannot be processed at an atmosphere under a high vacuum.

In the conventional plasma processing apparatus having a single magnet arranged as in FIG. 4, the magnetic flux density increases uniformly from the center radially. Therefore, a uniform magnetic field distribution cannot be provided. Therefore, nonuniformity is exhibited in plasma density.

In the plasma processing apparatus having a plurality of magnets arranged in parallel with alternate polarity between adjacent magnets as shown in FIGS. 6(A) and 6(B), the drifting direction differs for every pair of adjacent magnets. An area of high plasma density is generated in the drifting direction to result in nonuniform plasma density. There was a problem that an object of a large area could not be etched uniformly.

In the plasma processing apparatus having separate plasma generation and processing chambers as shown in FIG. 9, the density of the plasma generated in the plasma generation chamber is low. Therefore, plasma of high density cannot be introduced into the processing chamber. As a result, the process cannot be carried out at high speed. There was also a problem that the object cannot be processed at the atmosphere under a high vacuum if the plasma density is increased.

SUMMARY OF THE INVENTION

An object of the present invention is to provide a plasma processing apparatus that can form plasma uniformly over a large area and that can process an object of a large diameter uniformly.

Another object of the present invention is to provide a plasma processing apparatus with a higher density of plasma generated at a plasma generation chamber to carry out high speed processing in a high vacuum atmosphere.

A further object of the present invention is to provide a plasma processing apparatus that can generate plasma of high density uniformly over a large area, and that can process an object of a large diameter at a uniform high speed in a high vacuum atmosphere.

According to an aspect of the present invention, a plasma processing apparatus includes a processing chamber having a first electrode on which an object to be processed is placed, a plasma generation chamber having a second electrode arranged opposite to the first electrode, and a partition panel provided between the processing chamber and the plasma generation chamber, having a hole communicating from the plasma generation chamber to the processing chamber. The plasma generation chamber is electrically insulated with respect to the processing chamber, and has a voltage applied in a pulsive manner.

Preferably, the junction portion between the plasma generation chamber and the processing chamber is provided with an insulation member.

By providing electrical insulation between the plasma generation chamber and the processing chamber and by applying a direct current voltage in a pulsive manner to the plasma generation chamber, the plasma in the plasma generation chamber is drawn to the processing chamber by the applied voltage in addition to the pressure difference between the plasma generation chamber and the processing chamber. By the two effects, plasma can be drawn from the plasma generation chamber to the processing chamber more efficiently. As a result, the processing speed of an object of interest is improved. Also, the accuracy of the process of a fine pattern can be improved.

Preferably, etching gas is introduced into a plasma generation chamber in synchronization with the pulse of the direct current voltage applied to the plasma generation chamber. By introducing etching gas into the plasma generation chamber in synchronization, the pressure in the plasma generation chamber can be increased effectively to direct the plasma from the plasma generation chamber to the processing chamber in a more favorable state. Therefore, an object of interest can be processed more efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An etching apparatus will be described hereinafter with reference to the drawings as an embodiment of a plasma processing apparatus of the present invention.

First Embodiment

Figure 1:
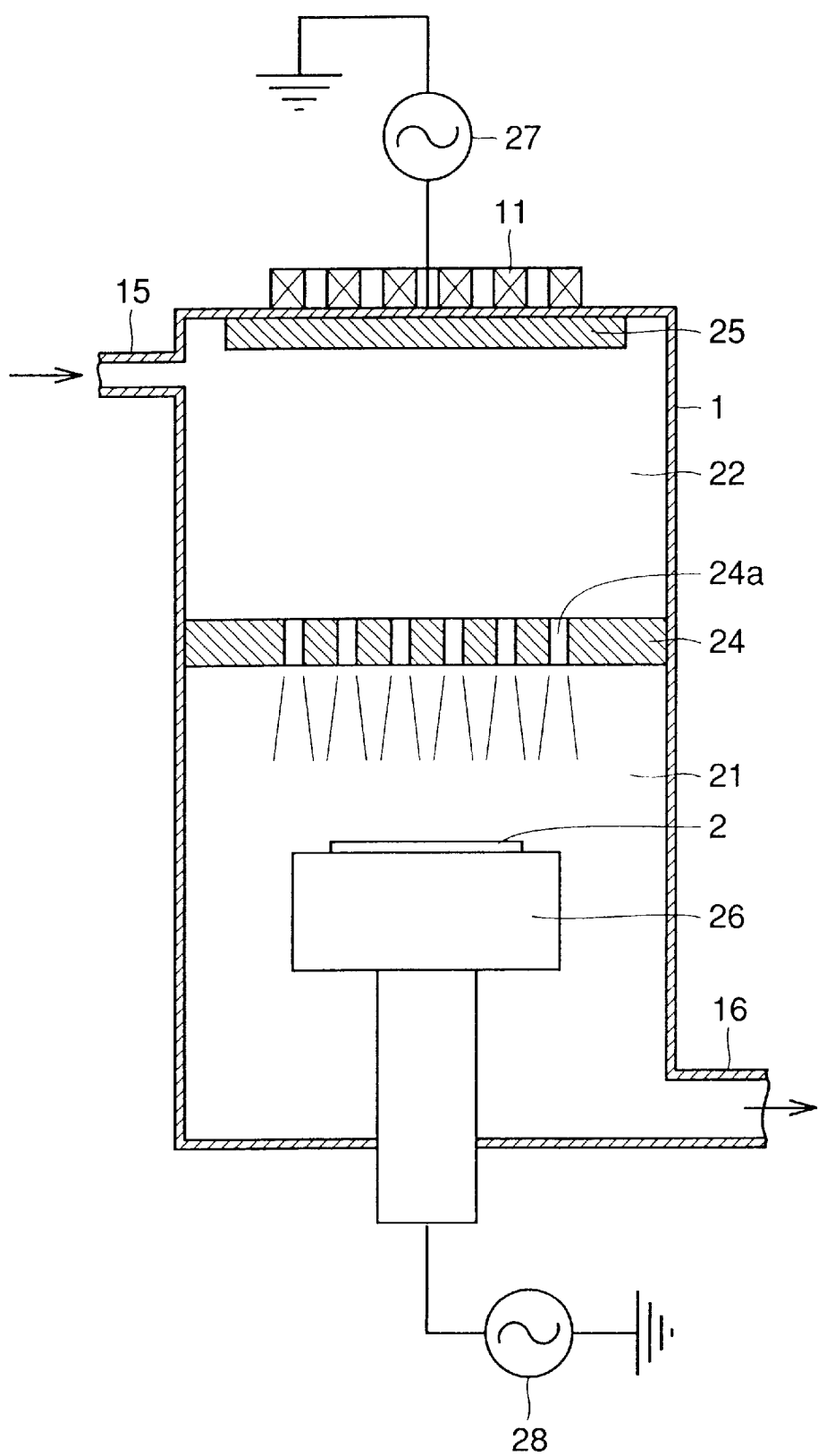
FIG. 1 is a sectional view of a structure of a plasma dry etching apparatus according to a first embodiment of the present invention.

Referring to FIG. 1, a processing chamber 21 is provided in a vacuum vessel 1 of a plasma dry etching apparatus according to the first embodiment of the present invention. A stage 26 forming a first electrode on which an object 2 to be processed is placed is provided in processing chamber 21. High frequency power is supplied to stage 26 by a high frequency power source 28. A plasma generation chamber 22 is also provided in vacuum vessel 1. A partition panel 24 is provided between processing chamber 21 and plasma generation chamber 22. A plurality of holes 24a are formed in partition panel 24.

Etching gas is supplied into plasma generation chamber 22 from a gas conduit 15. The etching gas supplied to plasma generation chamber 22 passes through holes 24a of partition panel 24 to be introduced into processing chamber 21. The etching gas is exhausted outside through an exhaust port 16. In discharging the etching gas outside, processing chamber 21 is evacuated by a vacuum pump not shown. Processing chamber 21 is maintained in a vacuum higher than plasma generation chamber 22.

A second electrode 25 is mounted at a side of plasma generation chamber 22 opposite partition panel 24. High frequency power is supplied to second electrode 25 by a high frequency power source 27. An annular permanent magnet 11 is arranged at the atmosphere side of second electrode 25.

According to the plasma dry etching apparatus of the above structure, etching gas introduced into plasma generation chamber 22 passes through holes 24a of partition panel 24 into processing chamber 21 and output through exhaust port 16.

By applying high frequency power to second electrode 25 of plasma generation chamber 22, ionization is promoted by the E×B drift caused by the magnetic field produced by permanent magnet 11 arranged in the proximity of second electrode 25 and the electric field. As a result, high density plasma is generated. The plasma generated at plasma generation chamber 22 is conveyed into processing chamber 21 via holes 24a of partition panel 24 to etch object 2 mounted on stage 26.

The configuration of the apparatus for etching an object of a large diameter will be described hereinafter using specific numerics. At the atmosphere side of second electrode 25 of plasma generation chamber 22, three annular permanent magnets 11 are arranged concentrically. E×B drift caused by the electric field formed in the proximity of electrode 25 and the magnetic field occurs at the neighborhood of second electrode 25. However, locally dense plasma will not be generated. This is due to the fact that annular permanent magnets are arranged. Among the magnetic field formed in the proximity of second electrode 25, the magnetic field component in the direction of the circumference of second electrode 25 is 0. Therefore, plasma can be generated uniformly over a large area.

The surface magnetic field intensity of annular permanent magnet 11 is set to 3000 gauss. The distance between respective annular permanent magnets 11 is set to 50 mm. The distance between annular permanent magnet 11 to second electrode 25 is set to 40 mm. The distance between electrode 25 and partition panel 24 is set to 80 mm.

The volume of plasma generation chamber 22 is set to 10 liters. The volume of processing chamber 21 is set to 50 liters. The effective evacuation rate is set to 100 liters/second. The total area of holes 24a in partition panel 24 is set to approximately 7.0 cm$^2$. By using Cl$_2$ gas as etching gas and setting the pressure in plasma generation chamber 22 to 5 mTorr, the atmospheric pressure in processing chamber 21 becomes approximately 1 mTorr. By carrying out discharge under the above-described conditions, the plasma density in plasma generation chamber 22 becomes approximately 5×10$^9$ (particles/cm$^3$) to 5×10$^{10}$ (particles/cm$^3$), which is one order of magnitude higher than that without a magnetic field. Processing chamber 21 is maintained at a high vacuum, so that a fine pattern can be formed.

A polysilicon material of a gate circuit in the Fabrication of a semiconductor was etched using the plasma dry etching apparatus of the above structure. An object 2 of 6 inch in size could be processed at the etching rate of 100 nm/min with homogeneity of 5%.

Although not depicted, the uniformity of the etching rate can further be improved by providing a columnar permanent magnet at the center of the concentric circle of annular permanent magnets 11. In this case, the homogeneity of the magnetic field can be adjusted by setting the surface magnetic field intensity of the columnar permanent magnet higher or lower than the surface magnetic field intensity 300 gauss of the annular permanent magnet, Accordingly, uniform plasma can be generated at the plasma generation chamber to allow uniform etching.

By the apparatus of the above-described size and annular permanent magnets 11 of the above-described surface magnetic field intensity, a magnetic field of at least 100 gauss in intensity is generated in plasma generation chamber 22 and a magnetic field of not more than 200 gauss in intensity is generated in the proximity of stage 26 of processing chamber 21. As a result, plasma generation is promoted by the high magnetic field in the proximity of electrode 25 in plasma generation chamber 22 to maintain plasma of high density. The magnetic field is low in the proximity of object 2 to be processed. Therefore, processing of high quality can be carried out at high speed and with less etching damage.

Second Embodiment

Figure 2:
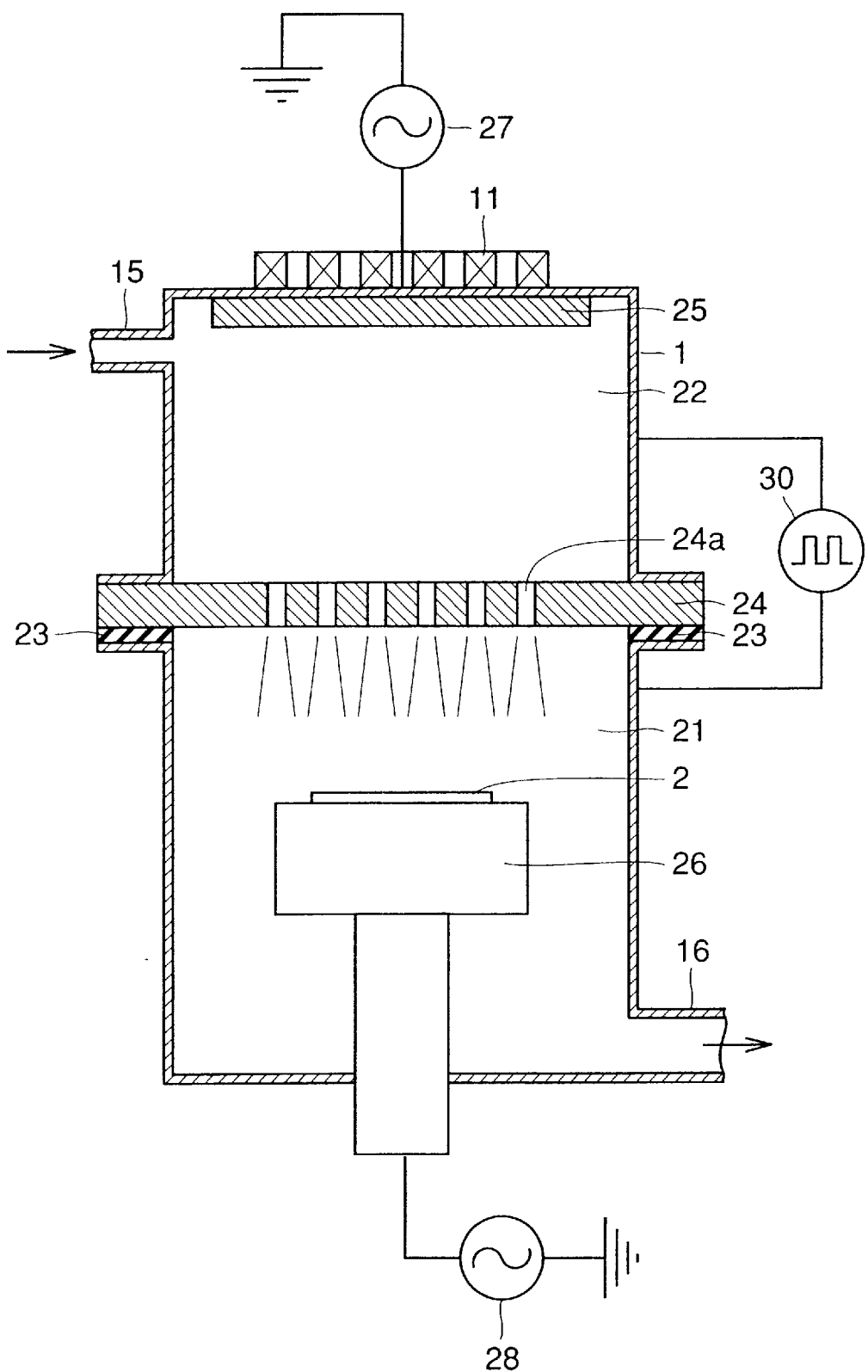
FIG. 2 is a sectional view of a structure of a plasma dry etching apparatus according to a second embodiment of the present invention.
Figure 3:
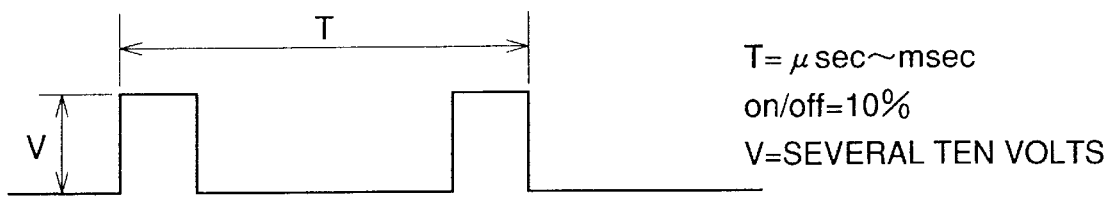
FIG. 3 shows the application condition of direct current to a plasma generation chamber.
Figure 4:
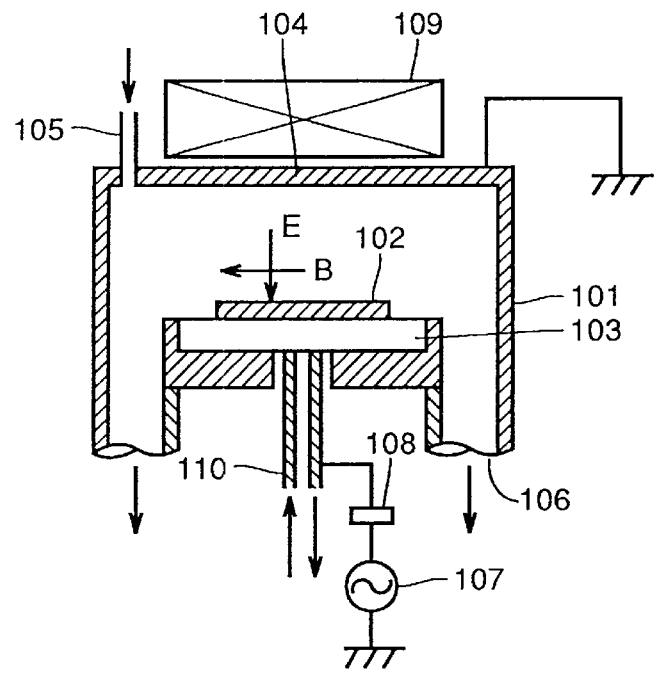
FIG. 4 is a sectional view of a plasma processing apparatus according to a first conventional example.
Figure 5A:
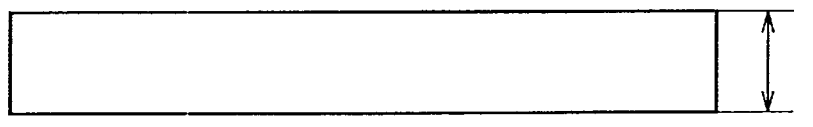
FIG. 5(A) shows a side view of a permanent magnet of the plasma processing apparatus of FIG. 4.
Figure 5B:
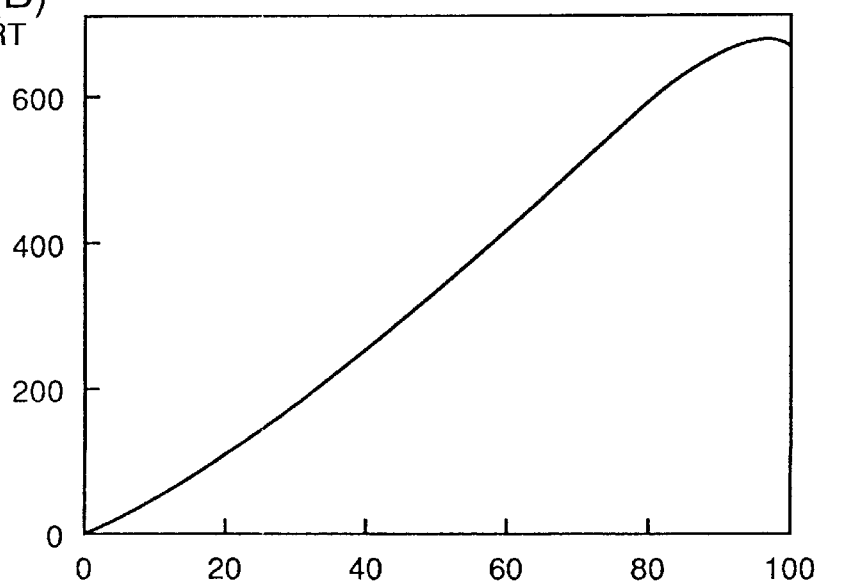
FIG. 5(B) shows magnetic field distribution of the permanent magnet of FIG. 5(A).
Figure 6A:
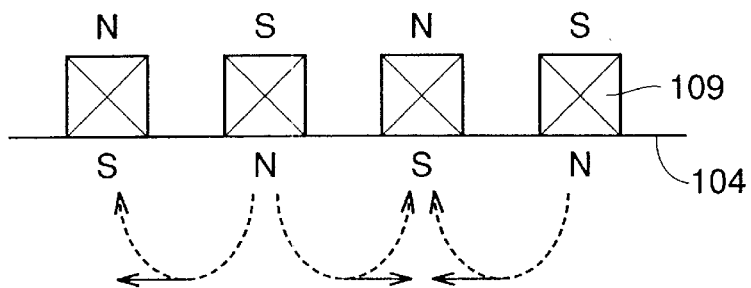
FIGS. 6(A) and 6(B) are schematic diagrams showing the drift of plasma in conventional art.
Figure 6B:
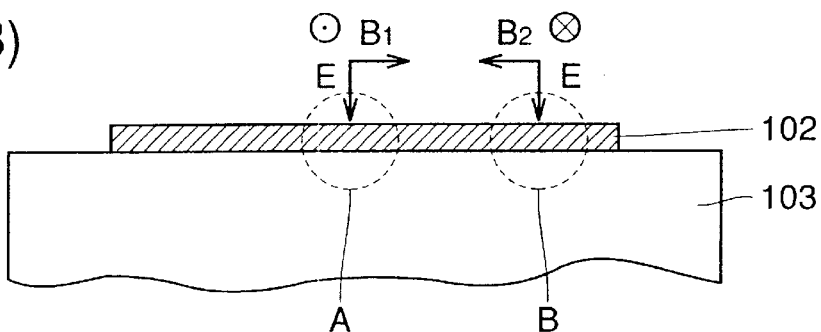
Figure 7A:
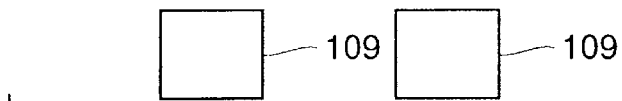
FIGS. 7(A) and 7(B) show the radial distribution of magnetic flux density $B\perp$ in the lateral direction at the surface of the second electrode of the plasma processing apparatus of conventional art.
Figure 7B:
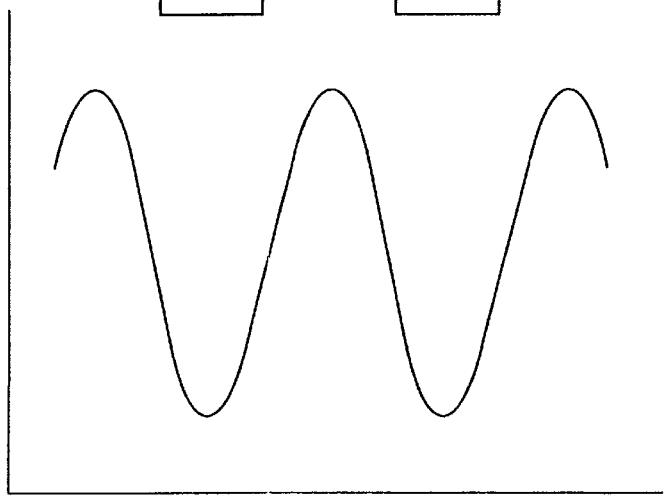
Figure 8:
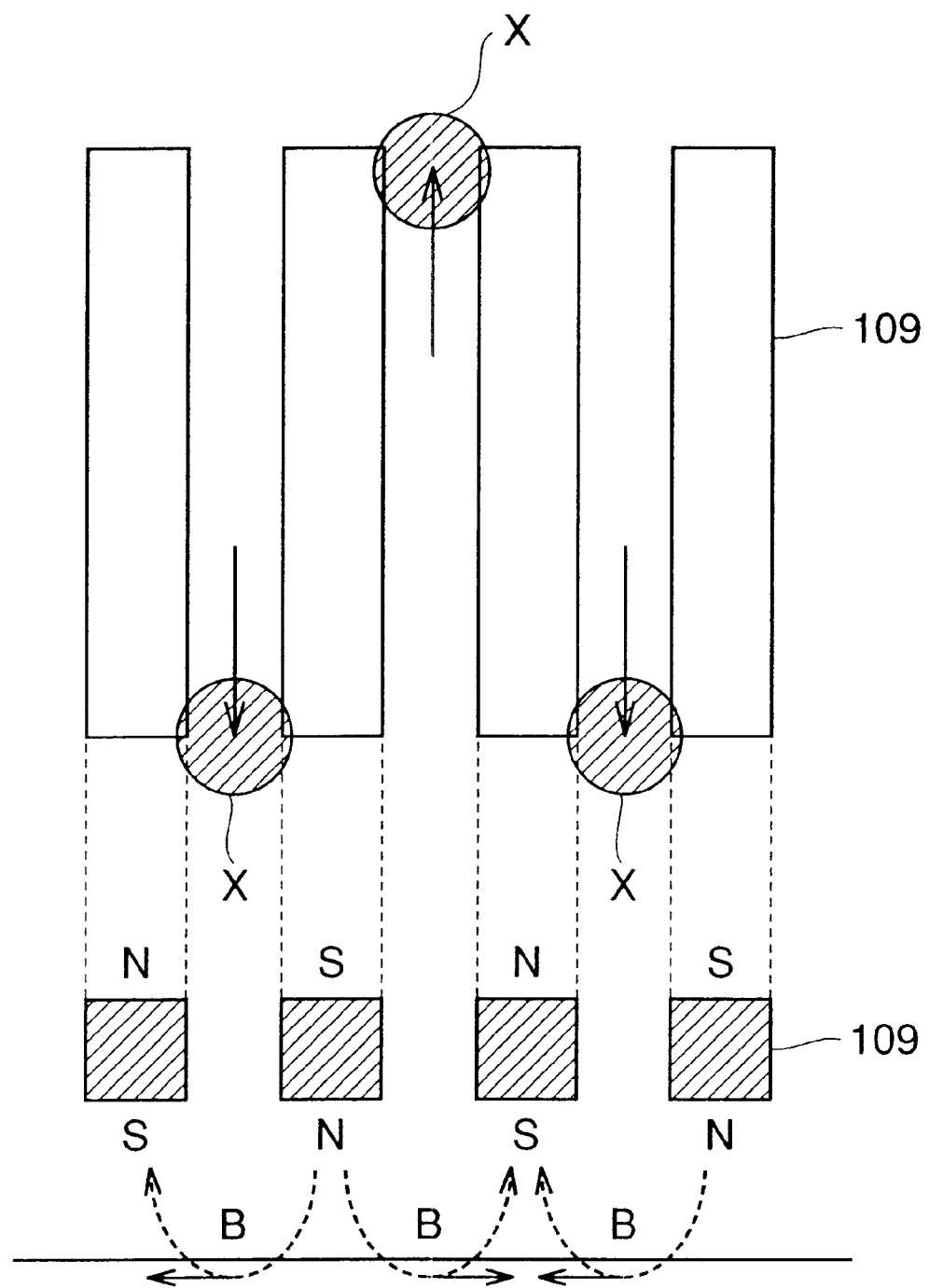
FIG. 8 is a diagram for describing plasma drift in a plasma processing apparatus of another conventional example.
Figure 9:
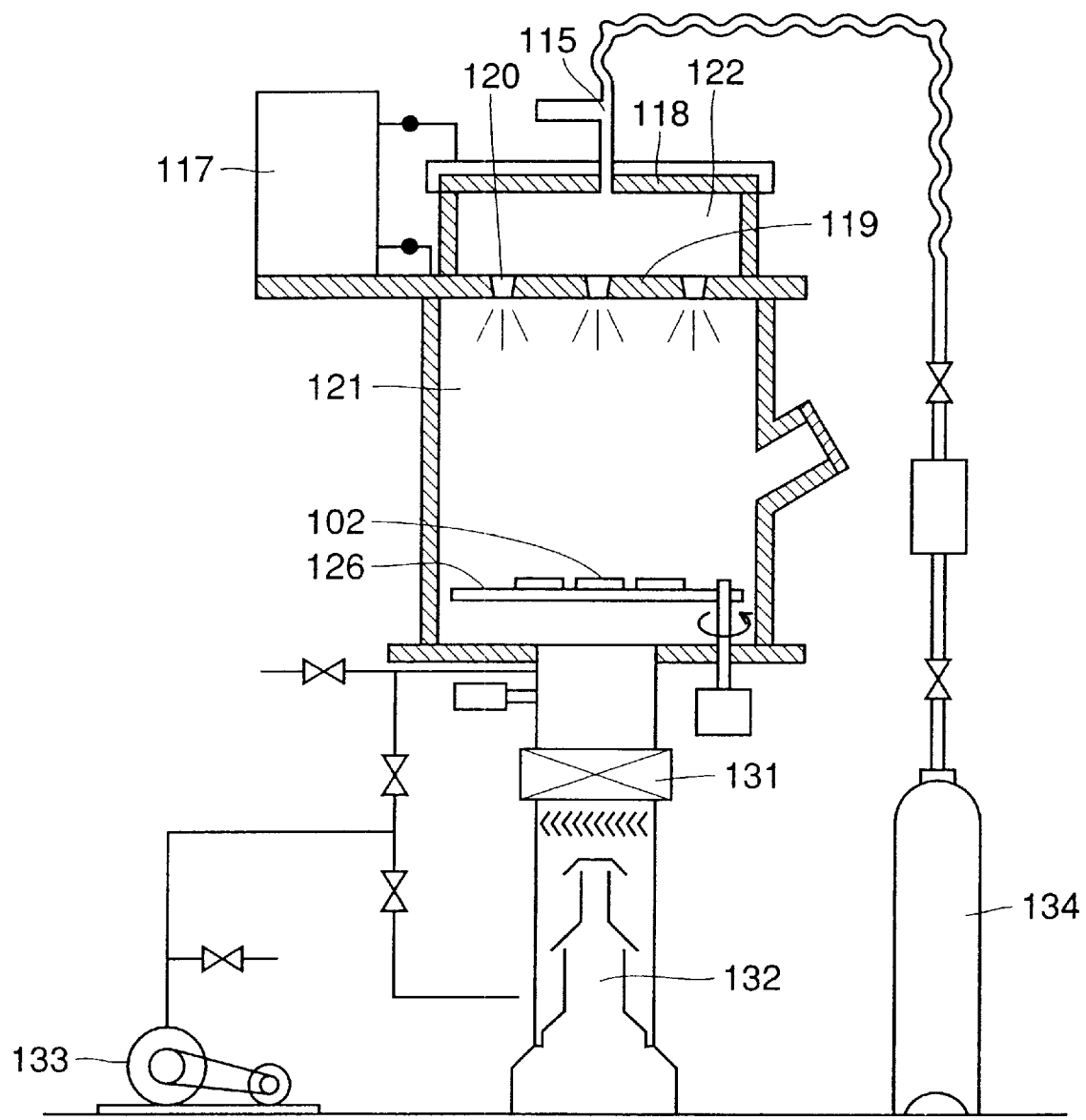
FIG. 9 schematically shows a structure of a dry etching apparatus of a conventional plasma processing apparatus.

A plasma processing apparatus according to a second embodiment of the present invention will be described hereinafter with reference to FIG. 2. FIG. 2 is a sectional view of a structure of a plasma etching apparatus of the second embodiment.

The plasma dry etching apparatus of the present embodiment has a structure similar to that of the first embodiment with insulation provided between plasma generation chamber 22 and processing chamber 21 by an insulation substrate 23. Although insulation substrate 23 is provided between partition panel 24 and processing chamber 21 in FIG. 2, insulation substrate 23 may be provided between plasma generation chamber 22 and partition panel 24. A direct current voltage application device 30 for applying a direct current voltage in a pulsive manner is connected to plasma generation chamber 22.

The direct current voltage applied by direct current voltage application device 30 has the application condition of an ON time of approximately 10% of the cycle time T=$\mu$sec~msec. The applied voltage is several ten volts. By electrically insulating plasma generation chamber 22 from processing chamber 21 and altering the potential in plasma generation chamber 22 in a pulsive manner, the plasma of plasma generation chamber 22 can be drawn out to processing chamber 21. As a result, the plasma generated at plasma generation chamber 22 can be drawn efficiently to processing chamber 21 in addition to the pressure difference between plasma generation chamber 22 and processing chamber 21. Therefore, the processing speed of object 2 placed in processing chamber 21 can be improved. Also, the process of a fine pattern can be carried out accurately.

The voltage applied to plasma generation chamber 22 can be either positive or negative. Charged particles are drawn out corresponding to the applied voltage, whereby the plasma is drawn out towards processing chamber 21 through holes 24a in partition panel 24.

The reason why the voltage to the plasma generation chamber is applied in a pulsive manner is due to the fact that steady application of voltage will cause a steady flow of plasma current to increase the capacitance of the direct current voltage application power source.

Preferably, the advantage set forth in the following can be expected by supplying etching gas in a pulsive manner into plasma generation chamber 22 in synchronization with the pulse of the applied voltage to plasma generation chamber 22. The pulsive supply of etching gas is realized by using a pulse valve. The pressure in plasma generation chamber 22 is highest at the time point when the gas is supplied. The pressure gradually becomes lower until the next supply of gas. The electron temperature of plasma is generally low when the pressure is high and high when the pressure is low. Therefore, plasma of a desired electron temperature can be drawn out by synchronizing the supply of etching gas with the application of direct current voltage to plasma generation chamber 22.

The electron temperature of plasma is related to the etching configuration of the object to be processed. The etching characteristics of an object of interest can be controlled by altering the timing of etching gas supply and direct current voltage application.

Although a parallel-plate type plasma generation apparatus for generating plasma has been described in the above first and second embodiments, the plasma generation apparatus is not limited to this type. A similar effect can be achieved by using a plasma generation apparatus of the inductive coupling type, IPC type, ECR type, magnetron type, and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:
   a processing chamber having a first electrode on which an object to be processed is placed;
   a plasma generation chamber having a second electrode arranged opposite to said first electrode; and
   a partition panel provided between said processing chamber and said plasma generation chamber, and having a hole communicating from said plasma generation chamber to said processing chamber;
   wherein said plasma generation chamber is electrically insulated from said processing chamber, and a power source is adapted to provide a voltage in a pulsing manner to said plasma generation chamber.

2. The plasma processing apparatus according to claim 1, wherein an insulation member is provided at a junction portion of said plasma generation chamber and said processing chamber.

* * * * *